United States Patent
Maeda

(10) Patent No.: US 9,535,321 B2
(45) Date of Patent: Jan. 3, 2017

(54) IMPRINT APPARATUS AND ARTICLE MANUFACTURING METHOD

(75) Inventor: Hironori Maeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 392 days.

(21) Appl. No.: 13/025,436

(22) Filed: Feb. 11, 2011

(65) Prior Publication Data

US 2011/0198769 A1     Aug. 18, 2011

(30) Foreign Application Priority Data

Feb. 17, 2010  (JP) .................................. 2010-032037

(51) Int. Cl.
 *B29C 59/02* (2006.01)
 *G03F 7/00* (2006.01)
 *B82Y 10/00* (2011.01)
 *B82Y 40/00* (2011.01)

(52) U.S. Cl.
 CPC ............. *G03F 7/0002* (2013.01); *B82Y 10/00* (2013.01); *B82Y 40/00* (2013.01)

(58) Field of Classification Search
 CPC ..................................................... B29C 59/02
 USPC ......................................... 264/40.1; 425/169
 See application file for complete search history.

(56) References Cited

U.S. PATENT DOCUMENTS

| 7,273,685 | B2 | 9/2007 | Sasazawa et al. | |
|---|---|---|---|---|
| 2005/0037143 | A1* | 2/2005 | Chou et al. | 427/248.1 |
| 2005/0185169 | A1 | 8/2005 | McMackin et al. | |

FOREIGN PATENT DOCUMENTS

| JP | 04355350 A | 12/1992 |
|---|---|---|
| JP | 08-247958 A | 9/1996 |
| JP | 2005191444 A | 7/2005 |
| JP | 2005214980 A | 8/2005 |
| JP | 2006-228843 A | 8/2006 |
| JP | 2007078356 A | 3/2007 |
| JP | 2007-523492 A | 8/2007 |
| JP | 2008194838 A | 8/2008 |
| JP | 2008276920 A | * 11/2008 |
| JP | 2008302519 A | * 12/2008 |
| JP | 2009143089 A | 7/2009 |
| WO | 2009153926 A1 | 12/2009 |

OTHER PUBLICATIONS

English abstract of JP2008276920.*
English abstract of JP2008302519.*
Japanese Office Action cited in Japanese counterpart application No. JP2010-032037, dated Nov. 19, 2013. English translation provided.

* cited by examiner

*Primary Examiner* — Christina Johnson
*Assistant Examiner* — Xue Liu
(74) *Attorney, Agent, or Firm* — Rossi, Kimms & McDowell LLP

(57) ABSTRACT

The imprint apparatus of the present invention molds an uncured resin on a substrate using a mold to form a resin pattern on the substrate. The apparatus includes a measuring device configured to project a light onto the mold, to receive a light scattered by the mold, and to measure the scattered light; and a controller. The controller is configured to store a reference signal, to cause the measuring device to measure the mold to obtain a measurement signal, and to obtain an index indicating a discrepancy between the measurement signal and the reference signal.

24 Claims, 7 Drawing Sheets

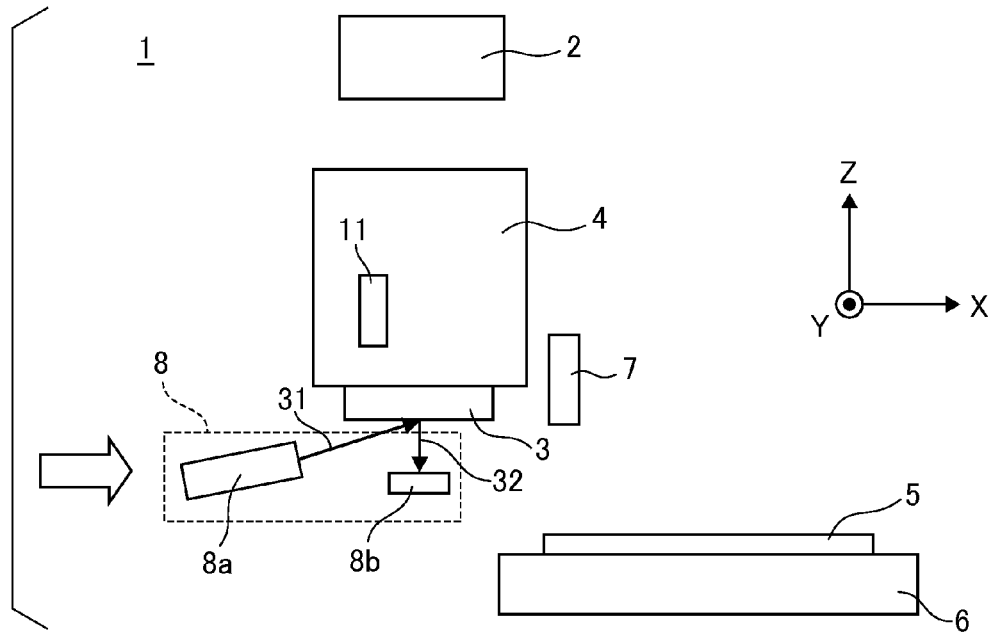
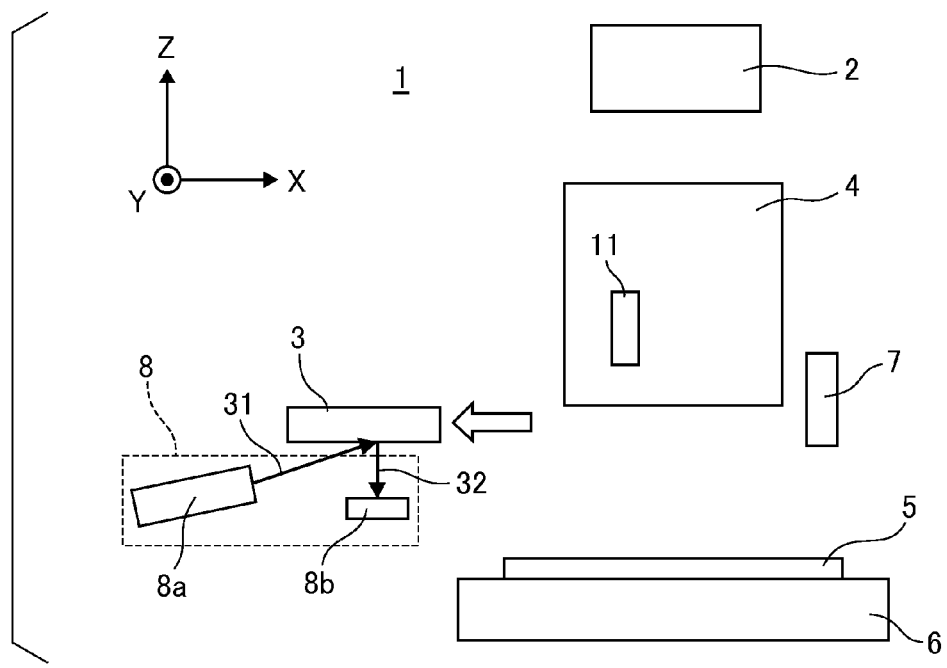

IMPRINT APPARATUS AND ARTICLE MANUFACTURING METHOD

BACKGROUND OF THE INVENTION

Field of the Invention

The present invention relates to an imprint apparatus that molds an uncured resin on a substrate using a mold to form a resin pattern on the substrate, and an article manufacturing method using the same.

Description of the Related Art

As the demand for microfabrication of semiconductor devices increases, not only a conventional photolithography technique but also a microfabrication technique in which an uncured resin on a substrate is molded by a mold to thereby form a resin pattern on the substrate have attracted attention. This technique is also referred to as an "imprint technique", by which a fine structure with dimensions of a few nanometers can be formed on the substrate. One example of imprint techniques includes a photo-curing method. An imprint apparatus employing the photo-curing method firstly applies an ultraviolet curable resin (imprint resin, photocurable resin) to the shot area (imprint area) on the substrate (wafer). Next, the resin (uncured resin) is molded by a mold. After the ultraviolet curable resin is irradiated with ultraviolet light for curing, the cured resin is released from the mold, whereby a resin pattern is formed on the substrate.

On the other hand, since the imprint apparatus brings the mold into contact with the substrate, the cured resin may be released from the substrate to thereby attach to the mold, or a defect may occur in the mold due to being pulled by the cured resin. When a foreign matter is attached to the mold or a defect is present on the mold, a desired resin pattern cannot be formed, which is undesirable in terms of production yield. Accordingly, Japanese Patent Laid-Open No. 2007-523492 discloses a method for determining a mold abnormality by measuring the characteristics of a film formed on a substrate.

However, although the method disclosed in Japanese Patent Laid-Open No. 2007-523492 measures the characteristics of a film formed on a substrate, an abnormality in the characteristics of a film may also occur due to a foreign matter on a substrate or a defect in a mold. Consequently, the method may determine that the mold has an abnormality even if no abnormality actually exists in the mold. Therefore, even if no abnormality actually exists in the mold, the mold may need to be removed from the imprint apparatus to perform an inspection and washing of the removed mold.

SUMMARY OF THE INVENTION

Accordingly, the present invention provides, for example, an imprint apparatus that is advantageous in terms of mold inspection.

According to an aspect of the present invention, An imprint apparatus that molds an uncured resin on a substrate using a mold to form a resin pattern on the substrate, the apparatus has a measuring device configured to project a light onto the mold, to receive a light scattered by the mold, and to measure the scattered light; and a controller, wherein the controller is configured to store a reference signal, to cause the measuring device to measure the mold to obtain a measurement signal, and to obtain an index indicating a discrepancy between the measurement signal and the reference signal.

According to the present invention, an imprint apparatus that is advantageous for, for example, mold inspection can be provided.

Further features of the present invention will become apparent from the following description of exemplary embodiments with reference to the attached drawings.

BRIEF DESCRIPTION OF THE DRAWINGS

FIG. 5A is a schematic diagram illustrating the positional relationship between a mold and a mold measurement system when a pattern inspection for causing the mold measurement system to scan the mold upon wafer exchange is performed.

FIG. 5B is a schematic diagram illustrating the positional relationship between the mold and the mold measurement system when a pattern inspection for scanning the mold is performed with respect to the mold measurement system upon mold exchange.

DESCRIPTION OF THE EMBODIMENTS

Hereinafter, preferred embodiments of the present invention will now be described with reference to the accompanying drawings.

(Imprint Apparatus)

Figure 1:
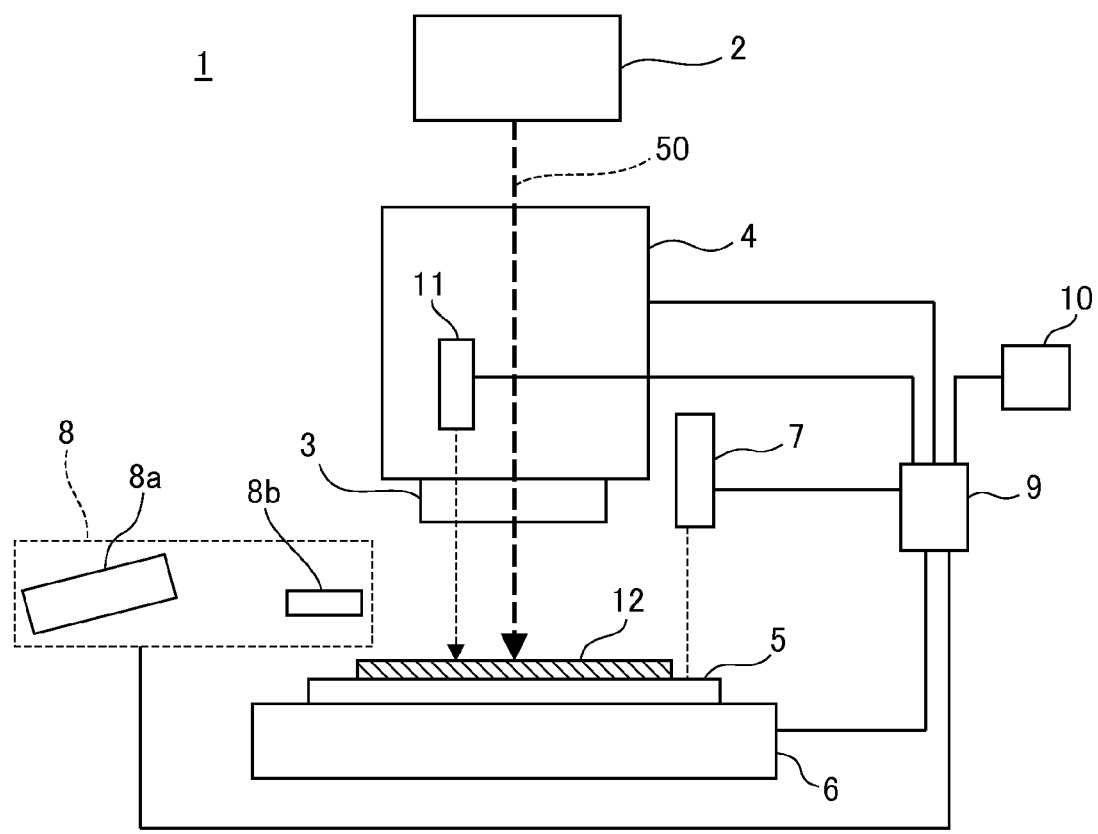
FIG. 1 is a schematic diagram illustrating the configuration of an imprint apparatus according to an embodiment of the present invention.

First, a description will be given of the configuration of an imprint apparatus according to an embodiment of the present invention. FIG. 1 is a schematic diagram illustrating the configuration of an imprint apparatus. The imprint apparatus according to the present embodiment is a processing apparatus that transfers the concave and convex pattern of a mold to a wafer (a substrate), i.e., a treatment object substrate, which is used for a semiconductor device manufacturing process, and is an apparatus that employs a photo-curing method among the imprint techniques. In the following drawings, a description will be given in which the Z axis is oriented in parallel to the irradiation axis of ultraviolet light for a mold, the X axis is oriented in the direction in which a mold measurement system moves with respect to an imprint head to be described below in a plane perpendicular to the Z axis, and the Y axis is oriented in the direction perpendicular to the X axis. The imprint apparatus 1 of the present invention includes an illumination system 2, a mold 3, an imprint head 4, a wafer 5, a wafer stage 6, a dispenser 7, a mold measurement system 8, a controller 9, and a console section 10.

The illumination system 2 is an illumination unit configured to irradiate the mold 3 with an ultraviolet light 50 during imprint processing. The illumination system 2 is constituted by a light source and a plurality of optical elements that adjust ultraviolet light emitted from the light source to a light suitable for imprint, neither of which are shown in FIG. 1. Also, the mold 3 is a mold (mold material) in which a predetermined concave and convex pattern (e.g., circuit pattern) is three-dimensionally formed on the opposite surface of the wafer 5. The surface of the concave and convex pattern is processed at high flatness so as to maintain the adhesion between the wafer 5 and the surface. Note that the material of the mold 3 is a material such as quartz or the like through which ultraviolet light can pass.

The imprint head 4 is a mold holder including a mount (not shown), i.e., a mold holding unit configured to hold and fix the mold 3; a mount driving mechanism (not shown) for driving the mount; and an alignment detection system 11. More specifically, the mount driving mechanism drives the mount in the Z-axial direction so as to press the mold 3 against the ultraviolet curable resin 12 formed on the wafer 5. An actuator employed for the driving mechanism is not particularly limited as long as it can drive at least in the Z-axial direction. A linear motor, an air cylinder, and the like can be employed. Alternatively, in order to perform a mold-release operation with high precision so as to prevent the cured ultraviolet curable resin 12 from being damaged when a mold-release operation for releasing the mold 3 from the ultraviolet curable resin 12 is performed, an actuator may be employed to carry out a coarse operation and a micro operation in a divided manner. An alignment detection system 11 is a position measurement unit configured to optically observe an alignment mark formed on the mold 3 and an alignment mark formed on the wafer 5 to thereby measure the relative positional relationship therebetween.

Note that the alignment detection system 11 needs only to be able to measure the relative positional relationship between the mold 3 and the wafer 5. Hence, the alignment detection system 11 may be configured such that an image-forming optical system for observing images of the mold 3 and the wafer 5 is constructed therein or may be configured to detect a signal generated by the combined effect of an interference signal and moiré (interference fringe) of the mold 3 and the wafer 5.

The wafer 5 is a treatment object substrate consisting of, for example, a single crystal silicon, and the ultraviolet curable resin 12, which serves as a molding section, is applied on the treatment surface. Also, the wafer stage 6 is a substrate holding unit configured to hold the wafer 5 by vacuum suction and be freely moveable in the XY plane. As an actuator for driving the wafer stage 6, a linear motor can be employed, but this is not particularly limited.

The dispenser 7 is an application unit configured to apply the ultraviolet curable resin 12 on the wafer 5. The ultraviolet curable resin 12 is a photocurable resin (imprint resin) having curing characteristics that is cured by ultraviolet light, and is appropriately selected depending on the type of a semiconductor device to be manufactured. Hereinafter, the ultraviolet curable resin 12 is simply designated as "resin", and a resin that is in an uncured state prior to ultraviolet light irradiation is simply designated as "uncured resin" for ease of explanation.

The mold measurement system 8 includes a light projecting unit 8a and a light receiving unit 8b, and is a measurement unit configured to directly inspect the concave and convex pattern formed on the mold 3 in a state in which the mold 3 is present within the imprint apparatus 1. While the concave and convex pattern formed on the mold 3 is actually a very fine pattern, the following description will be given on an assumption that the concave and convex pattern has three convex portions (the convex portions 3a to 3c in FIG. 2A and thereafter) for ease of explanation. The mold measurement system 8 exposes irradiation light (irradiation light 31 in FIGS. 5A and 5B), which has been irradiated by the light projecting unit 8a, to the concave and convex pattern of the mold 3, for example, a convex portion 3a to thereby detect scattered-light (scattered-light 32 in FIGS. 5A and 5B) from the convex portion 3a by the light receiving section 8b. The detected signal is transmitted to the controller 9 to be described below. In the present embodiment, the light projecting unit 8a is installed in the formation direction of the concave and convex pattern, i.e., in the direction tilted relative to the Z axis, whereas the light receiving section 8b is installed at the position perpendicular to the Z direction. According to the installation method, the mold measurement system 8 provided in the imprint apparatus 1 can be made smaller in size, and a measurement signal measured at each convex portion of the concave and convex pattern can be detected appropriately. Note that the installation method is not limited but may be appropriately selected. Depending on the method for measuring a concave and convex pattern, the mold measurement system 8 may have a measurement system driving mechanism (not shown) that is appropriately moveable in the X-axis direction. The details of which will be described below.

The controller 9 is a control unit configured to control the operation, adjustment, and the like of the components of the imprint apparatus 1. The controller 9 is constituted by a computer, a sequencer, and the like having a magnetic storage medium (not shown) and the like that is connected to the components of the imprint apparatus 1 through a circuit, and executes control of the components by a program or a sequence. Note that the controller 9 may be integrated with the imprint apparatus 1, or may be installed at a location separate from the location where the imprint apparatus 1 is installed to thereby be controlled remotely.

The console section 10 is connected with the controller 9, and is an operation unit, which serves as the user interface with the imprint apparatus 1, constituted by a monitor, input device, and the like. Using the console section 10, a user performs an input operation of various setting values (parameter value) and the operation content of the entire apparatus, and provides an operation command for the apparatus, and the like. Also, the console section 10 performs an operation state display for the entire apparatus or an error display when any trouble occurs on the apparatus, and appropriately informs the user about the moveable state of the apparatus to a user.

Figures 2A, 2B, 2C, 2D:
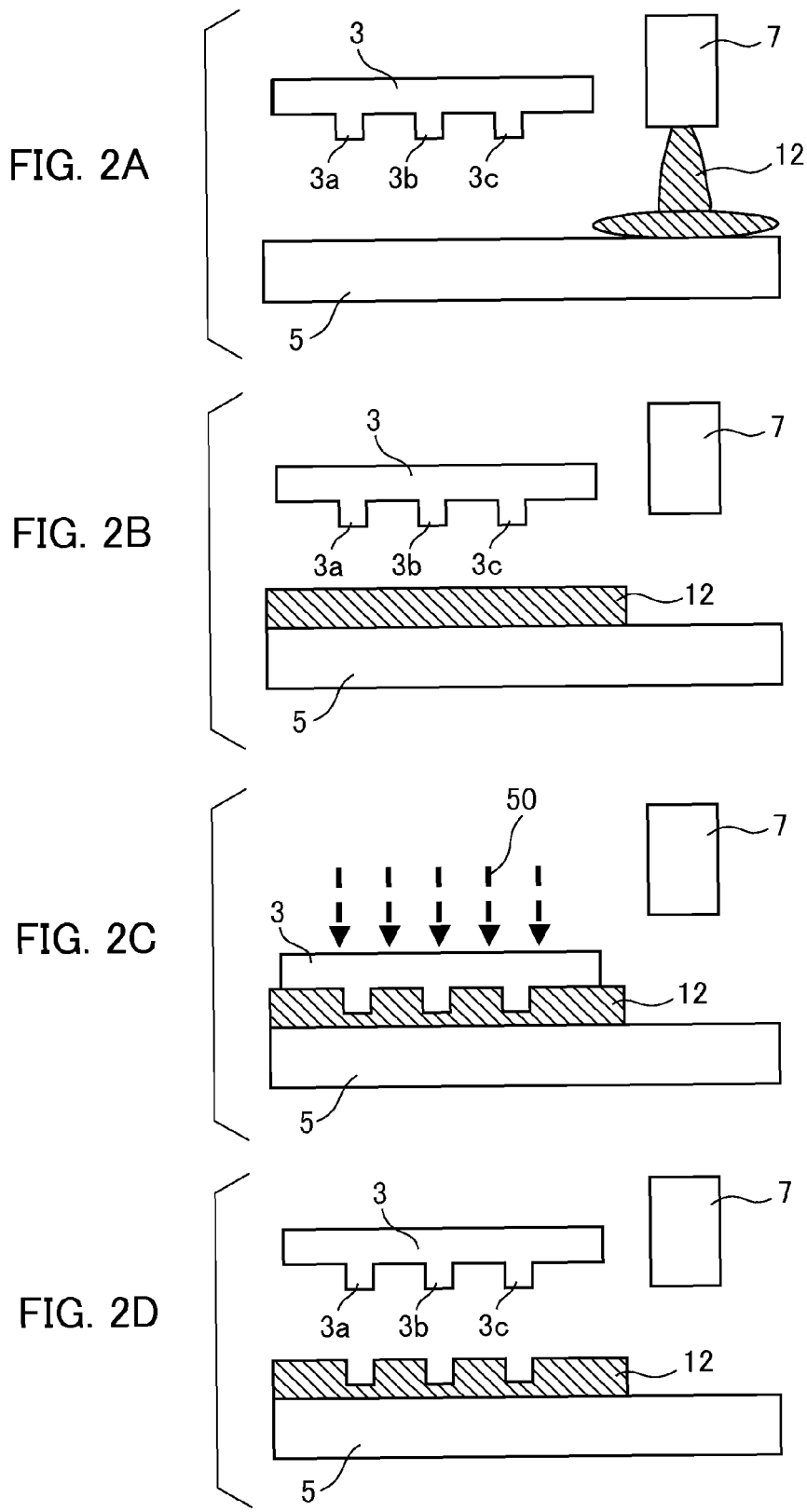
FIG. 2A is a schematic diagram illustrating a step of the pattern forming steps performed by the imprint apparatus.
FIG. 2B is a schematic diagram illustrating a step of the pattern forming steps performed by the imprint apparatus.
FIG. 2C is a schematic diagram illustrating a step of the pattern forming steps performed by the imprint apparatus.
FIG. 2D is a schematic diagram illustrating a step of the pattern forming steps performed by the imprint apparatus.
Figure 3A:
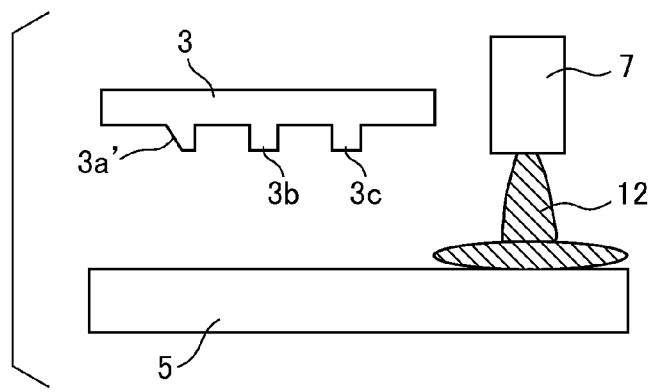
FIG. 3A is a schematic diagram illustrating a step of the pattern forming steps performed when a defect is present on a mold.
Figure 3B:
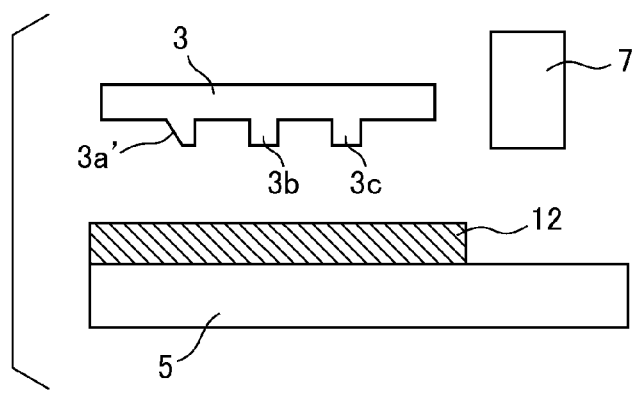
FIG. 3B is a schematic diagram illustrating a step of the pattern forming steps performed when a defect is present on a mold.
Figure 3C:
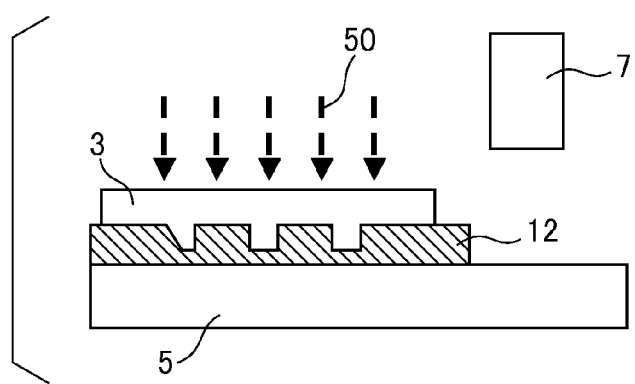
FIG. 3C is a schematic diagram illustrating a step of the pattern forming steps performed when a defect is present on a mold.
Figure 3D:
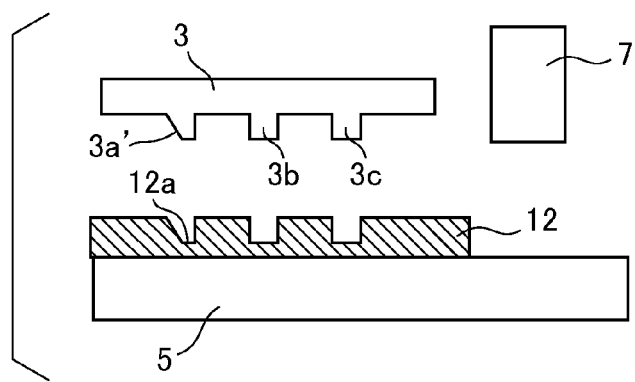
FIG. 3D is a schematic diagram illustrating a step of the pattern forming steps performed when a defect is present on a mold.

First, a pattern forming (imprint processing) using a typical imprint apparatus will be described for comparison. Each of FIGS. 2A to 2D is a schematic diagram illustrating the pattern forming step performed by the imprint apparatus. Note that in FIGS. 2A to 2D, the same elements as those shown in FIG. 1 are designated by the same reference numerals. First, as shown in FIG. 2A, the imprint apparatus 1 places and fixes the wafer 5 on the wafer stage 6, and then moves the wafer stage 6 to the application position of the dispenser 7. Then, the dispenser 7 applies a resin (uncured resin) 12 to a predetermined shot (treatment area) of the wafer 5. Next, as shown in FIG. 2B, the imprint apparatus 1 moves the wafer stage 6 such that the application surface on the wafer 5 is positioned below the mold 3. Next, as shown in FIG. 2C, the imprint apparatus 1 performs alignment of the pressing surface of the mold 3 with the application surface on the wafer 5, and then drives a mount driving mechanism provided in the imprint head 4 to thereby press the mold 3 into the resin 12 that has been applied on the wafer 5. At this time, the resin 12 flows along the concave and convex pattern formed on the mold 3 by pressing with the mold 3. Under this condition, the illumination system 2 emits the ultraviolet light 50 from the rear side (upper side) of the mold 3, and the resin 12 is cured by the ultraviolet light 50 that has been transmitted through the mold 3. Then, as shown in FIG. 2D, after the resin 12 is cured, the imprint apparatus 1 again drives the driving mechanism provided in the imprint head 4 to thereby release the mold 3 from the wafer 5. By the aforementioned steps, a three dimensionally shaped resin layer 12 following the concave and convex pattern of the mold 3 is formed on the shot surface of the wafer 5.

Figure 4:
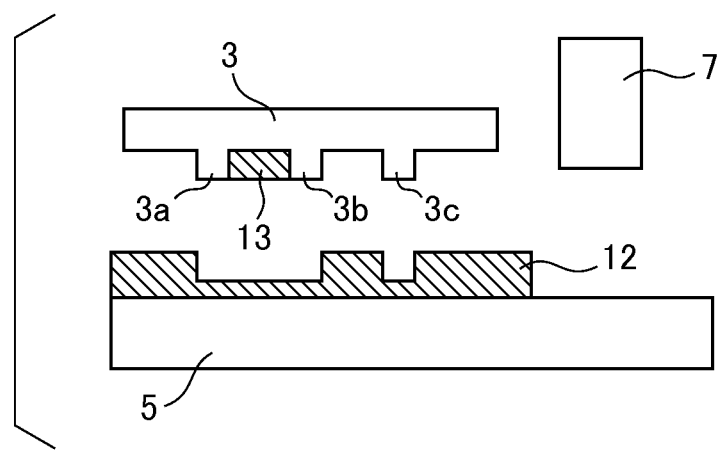
FIG. 4 is a schematic diagram illustrating a step of the pattern forming steps performed when an adhering matter is present on a mold.

Next, the pattern forming steps using a typical imprint apparatus when the concave and convex pattern of the mold 3 has an abnormality will be described. For example, Each of FIGS. 3A to 3D is a schematic diagram illustrating a pattern forming step when the mold 3 having a defective convex portion 3a' is used. Here, the steps shown in FIGS. 3A to 3D correspond to the steps shown in FIG. 2A to 2D, respectively. As shown in FIGS. 3A to 3D, if the defective convex portion 3a' is present on the mold 3, that pattern shape is transferred as it is to the resin 12, so that the imprint apparatus forms a defective fine pattern portion 12a. In contrast, FIG. 4 is a schematic diagram illustrating a pattern forming step when the mold 3 where an adhering matter 13 is present in the concave portion between the convex portion 3a and the convex portion 3b of the concave and convex pattern is used. Here, the step shown in FIG. 4 corresponds to the step shown in FIG. 3D. The imprint apparatus normally removes the mold 3 after the resin 12 is completely cured. However, there are cases in which the imprint apparatus removes the mold 3 prior to complete curing of the resin 12. In this case, as shown in FIG. 4, a part of the resin 12 adheres as the adhering matter 13 to the concave portion of the concave and convex pattern, resulting in an abnormality of the concave and convex pattern.

In the imprint apparatus, the shape itself of the concave and convex pattern formed on the mold 3 determines the line width of a device pattern formed on the wafer 5. Hence, as shown in FIG. 2, when the concave and convex pattern has no abnormality, an abnormality does not occur on the line width of the device pattern, whereas as shown in FIGS. 3A to 3D and FIG. 4, when an abnormality occurs on the concave and convex pattern, such an abnormality may cause deficiency in the device pattern. For example, when a defect occurs on the concave and convex pattern of the mold 3 shown in FIG. 3A, the device pattern corresponding to the defective portion fails to fulfill a desired line width, and thus, such a wafer cannot be used as a product, resulting in reduction in the production yield. Furthermore, when the mold 3, as shown in FIG. 4, on which an adhering matter is adhered to the concave and convex pattern thereof is kept for use, the device pattern corresponding to the adhered portion has a line width that is wider than a desired line width. Also, in this case, such wafer cannot be used as a product, resulting in reduction in the production yield. In general, the imprint apparatus uses the single mold 3 repeatedly to form a plurality of device patterns. Hence, it is particularly conceived that the mold 3 is damaged and thus abnormality may occur in the concave and convex pattern thereof as described above. Thus, according to the present invention, the concave and convex pattern of the mold 3 itself is measured by the mold measurement system 8 mounted in the imprint apparatus 1, whereby any abnormality in the concave and convex pattern is determined in a simple fashion.

Next, the action of the imprint apparatus 1 according to the present embodiment will be described. First, a description will be given of the positional relationship between the mold 3 and the mold measurement system 8, which measures the state of the concave and convex pattern, provided in the imprint apparatus 1. Each of FIGS. 5A and 5B is a schematic diagram illustrating the positional relationship between the mold 3 and the mold measurement system 8 provided in the imprint apparatus 1. In particular, FIG. 5A is a schematic diagram illustrating the positional relationship between the mold 3 and the mold measurement system 8 when a pattern inspection for causing the mold measurement system 8 to scan the mold 3 is performed upon exchange of the wafer 5 after the mold 3 is loaded into the inside of the imprint apparatus 1. The term "upon wafer exchange" in this case refers to the time upon which a first wafer (first substrate) 5 held by the wafer stage 6 is replaced by a new second wafer (second substrate) 5. In this case, the controller 9 controls the mold measurement system 8 such that it measures the concave and convex pattern of the mold 3 loaded on the imprint head 4 upon exchange of the wafer 5, i.e., during the period in which the wafer stage 6 moves from the imprint position as shown in FIG. 5A. More specifically, the mold measurement system 8 stands by at the peripheral position of the mold 3 during imprint processing, and moves to a vacant space below the mold 3 when imprint processing is ended and the wafer stage 6 is moved in order to exchange the wafer 5. An advantage of this type is that the mold measurement system 8 automatically performs measurement of the concave and convex pattern of the mold 3 as the wafer stage 6 moves upon exchange of the wafer 5, resulting in no effect on the throughput. Note that the mold measurement system 8 may be integrally arranged on a part of the wafer stage 6 (e.g., side face portion) such that the mold measurement system 8 can measure the concave and convex pattern every time upon exchange of the wafer 5.

In contrast; FIG. 5B is a schematic diagram illustrating the positional relationship between the mold 3 and the mold measurement system 8 when a pattern inspection for scanning the mold 3 with respect to the mold measurement system 8 upon exchange of the wafer 5 is performed after the mold 3 is loaded into the inside of the imprint apparatus 1. The term "upon mold exchange" in this case refers to the case where a mold (first mold) 3, which has already been held, is exchanged after imprint processing, and the alternative case where a mold (second mold) 3, which is being held, is exchanged prior to imprint processing. In other words, the controller 9 controls the mold measurement system 8 such that it automatically measures the concave and convex pattern of the mold 3 during the period which the mold (first mold) 3 is removed and moved from the imprint head 4 as shown in FIG. 5B. Alternatively, the controller 9 controls the mold measurement system 8 such that it automatically measures the concave and convex pattern of the mold 3 during the period in which the mold (second mold) 3 is moved towards the imprint head 4. An advantage of this type is that, in a typical imprint apparatus, since the mold 3 needs to be exchanged depending on the line width of the device pattern to be formed, it is preferred for the case where the mold 3 is frequently exchanged.

Figure 6A:
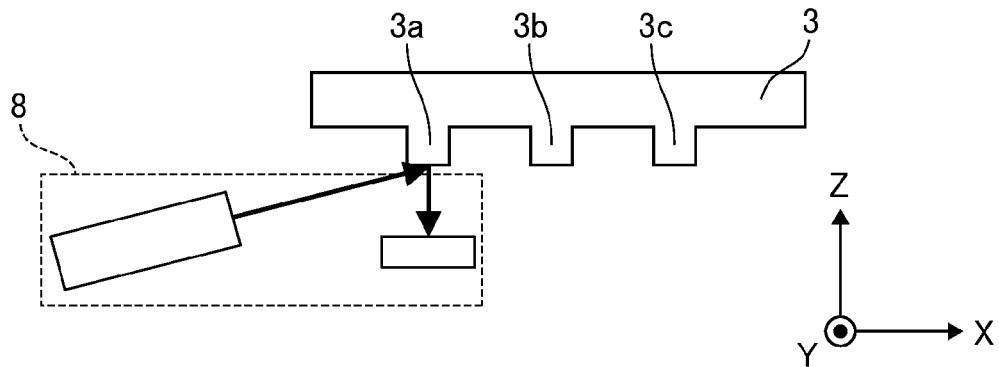
FIG. 6A is a schematic diagram illustrating an operation of the mold measurement system during scanning measurement.
Figure 6B:
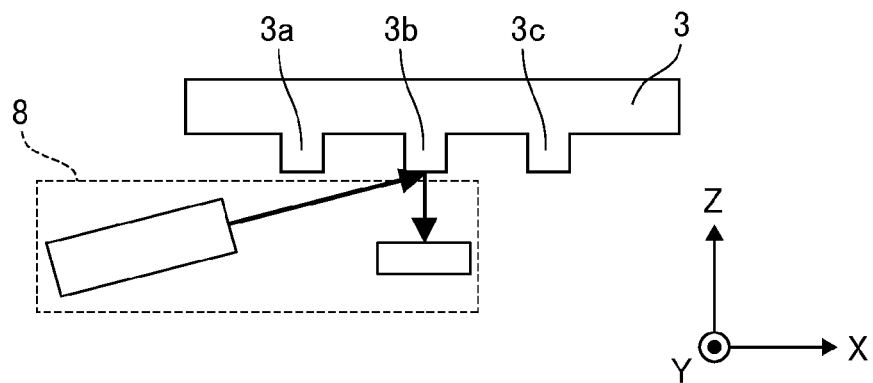
FIG. 6B is a schematic diagram illustrating an operation of the mold measurement system during scanning measurement.
Figure 6C:
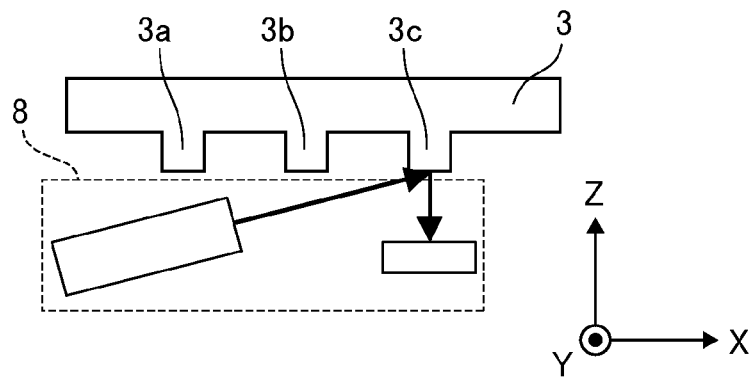
FIG. 6C is a schematic diagram illustrating an operation of the mold measurement system during scanning measurement.

Next, the operations of the mold measurement system 8 during scanning measurement of the concave and convex pattern will be described. Each of FIGS. 6A to 6C is a schematic diagram illustrating operations of the mold measurement system 8 during scanning measurement. Here, the scanning measurement shown in FIGS. 6A to 6C corresponds to FIG. 5A and is performed under the assumption that the mold measurement system 8 scans the mold 3 from left to right across the sheet in the X-axis direction with the mold 3 loaded on the imprint head 4. The mold measurement system 8 successively performs the scanning measurement as shown in FIGS. 6A to 6C to be described below. First, as shown in FIG. 6A, the mold measurement system 8 performs scanning measurement from the distal end of the concave and convex pattern of the mold 3 towards the center thereof so as to obtain a measurement signal point by point. Then, first the measurement signal for the convex portion 3a is obtained. Subsequently, the mold measurement system 8 performs scanning measurement to thereby obtain the measurement signal for the convex portion 3b at the center of the concave and convex pattern as shown in FIG. 6B. Furthermore, the mold measurement system 8 subsequently performs scanning measurement from the center of the concave and convex pattern of the mold 3 towards the other distal end thereof so as to obtain the measurement signal for the convex portion 3c as shown in FIG. 6C.

Figure 7A:
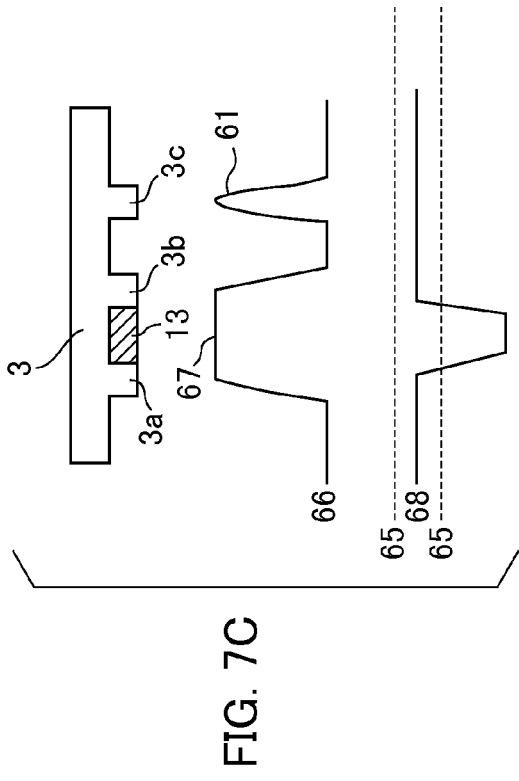
FIG. 7A is a diagram illustrating a measurement signal (a reference signal), which is measured by the mold measurement system, corresponding to the concave and convex pattern of a mold for first use.

Next, a measurement signal measured by scanning measurement performed by the mold measurement system 8 will be described. Each of FIGS. 7A to 7D is a diagram illustrating the mold 3 and its measurement signal, which is measured by the mold measurement system, corresponding to the states of the mold 3. In the present embodiment, first, when the mold 3 is loaded from the outside of the imprint apparatus 1 to the inside thereof, the mold measurement system 8 performs scanning measurement of the concave and convex pattern of the loaded mold 3, and stores the signal obtained by the scanning measurement as a reference signal to the storage unit or the like provided in the controller 9. FIG. 7A is a diagram illustrating the reference signal for the concave and convex pattern of the mold 3 for first use. As shown in FIG. 7A, since the mold 3 is a new one that has not yet been used for an imprint processing and thus has no abnormality in the concave and convex pattern thereof, a reference signal 60 has a hill-shaped pattern signal portion 61 which is uniform at the convex portions 3a to 3c.

Figure 7C:
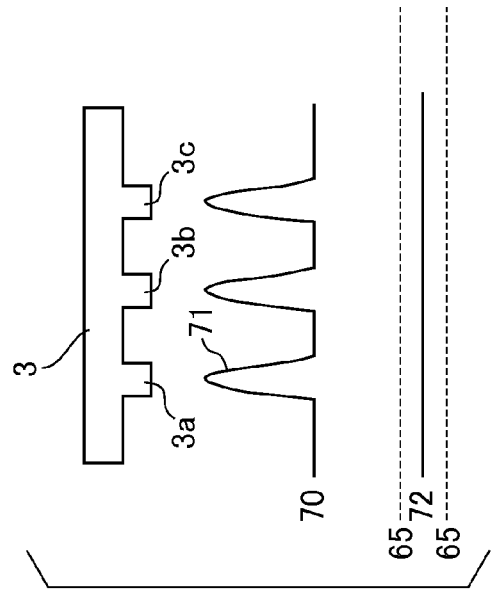
FIG. 7C is a diagram illustrating a measurement signal and index data measured by the mold measurement system when an adhering matter is present on the concave and convex pattern of the mold.
Figure 7B:
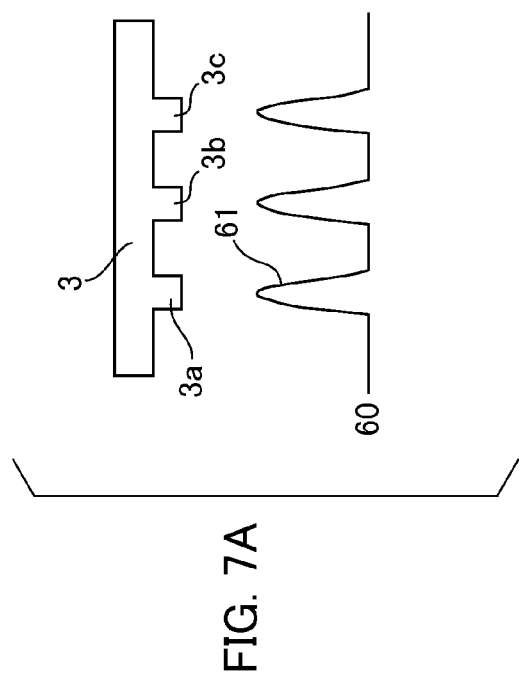
FIG. 7B is a diagram illustrating a measurement signal and index data measured by the mold measurement system when a defective convex portion is present on the concave and convex pattern of the mold.

Next, a description will be given of a case where a defect occurs on the mold 3 in a process in which the mold 3 is used in the imprint apparatus 1. FIG. 7B is a diagram illustrating a measurement signal and index data when a defective convex portion 3a' is present on the concave and convex pattern of the mold 3. First, the mold measurement system 8 obtains a measurement signal 62 as shown in FIG. 7B by scanning measurement. In this case, since a defect is present on the convex portion 3a' of the concave and convex pattern, the measurement signal 62 has a hill-shaped pattern signal portion 63, which is different from the shape of the other signal, at the portion corresponding to the convex portion 3a'. Next, the controller 9 compares the obtained measurement signal 62 with the reference signal 60, which is stored in advance, to thereby obtain an index data 64 as shown in FIG. 7B. The index data 64 is, for example, differential data that has been determined from the discrepancy between the reference signal 60 and the obtained measurement signal 62. Note that index data (index) is not limited to differential data but may be any discrepancy between the reference signal and the obtained measurement signal. For example, index data may be a correlation degree (correlation coefficient) between the reference signal and the measurement signal determined in terms of the entire signal or the corresponding portions. Next, the controller 9 obtains index information indicating whether or not the value of the calculated index data 64 exceeds a threshold value 65 having an upper limit value and a lower limit value that are set in advance, and outputs the index information to the console section 10. Here, if the value of the calculated index data 64 were to exceed the threshold value 65 as shown in FIG. 7B, the controller 9 determines that the mold 3 has an abnormality, and notifies the console section 10 about the abnormality occurrence. Consequently, the console section 10 performs an error display. In this manner, a user can instantly recognize that the mold 3 has an abnormality.

Next, a description will be given of a case where an adhering matter is present on the mold 3 in a process in which the mold 3 is used in the imprint apparatus 1. FIG. 7C is a diagram illustrating a measurement signal and index data when the adhering matter 13 is present on the concave and convex pattern of the mold 3. Also, in this case; the mold measurement system 8 obtains a measurement signal 66 as shown in FIG. 7C by scanning measurement. Since the adhering matter 13 is present on the concave and convex pattern of the mold 3, the measurement signal 66 has a large hill-shaped pattern signal portion 67, which is different from the shape of the other signal, at the portion corresponding to the adhering matter 13. Next, the controller 9 compares the obtained measurement signal 66 with the reference signal 60, which is stored in advance, to thereby obtain an index data 68 as shown in FIG. 7C. Next, the controller 9 obtains index information indicating whether or not the value of the calculated index data 68 exceeds a pre-set threshold value 65, and outputs the index information to the console section 10. Also, in this case, if the value of the calculated index data 68 were to exceed the threshold value 65 as shown in FIG. 7C, the controller 9 determines that the mold 3 has an abnormality. An error display provided by the console section 10 is performed in the same manner as in the foregoing.

Figure 7D:
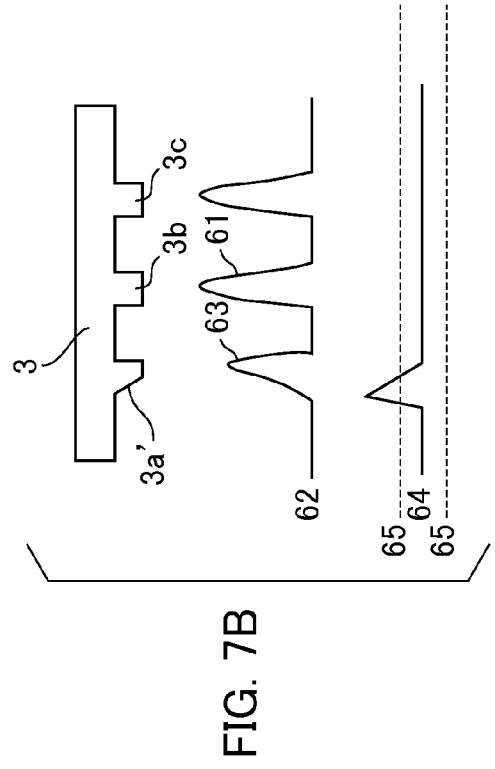
FIG. 7D is a diagram illustrating a measurement signal and index data measured by the mold measurement system when the concave and convex pattern of the mold has no abnormality.

For comparison, a description will be given of a case where the mold 3 has no abnormality in a process in which the mold 3 is used in the imprint apparatus 1. FIG. 7D is a diagram illustrating a measurement signal and index data when the concave and convex pattern of the mold 3 has no abnormality. Also, in this case, the mold measurement system 8 obtains a measurement signal 70 as shown in FIG. 7D by scanning measurement. However, since the concave and convex pattern of the mold 3 has no abnormality, the measurement signal 70 becomes a signal equivalent to the reference signal 60. Next, the controller 9 compares the obtained measurement signal 70 with the reference signal 60, which is stored in advance, to thereby obtain an index data 72 as shown in FIG. 7D. Then, the controller 9 obtains index information indicating whether or not the value of the calculated index data 72 exceeds a pre-set threshold value 65, and outputs the index information to the console section 10. In this case, since the index data 72 does not exceed the threshold value 65 as shown in FIG. 7D, the controller 9 determines that the mold 3 has no abnormality.

As described above, according to the imprint apparatus 1 of the present embodiment, the concave and convex pattern of the mold 3 can be readily inspected by the mold measurement system 8 installed in the imprint apparatus 1. Hence, when an abnormality occurs on the mold 3, the mold 3 can be exchanged instantly. This is advantageous for the production yield of an article to be manufactured by the imprint apparatus 1.

(Article Manufacturing Method)

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching. The article manufacturing method of this embodiment has an advantage, as compared with a conventional article manufacturing method, in at least one of performance, quality, productivity and production cost of an article.

While in FIGS. 7A to 7D, one-dimensional signal has been described for simplicity, the actual mold 3 has two-dimensional geometry, and thus it is preferable that the mold measurement system 8 measure the mold 3 in a two-dimensional manner. Also, a certain threshold value 65 shown in FIGS. 7B to 7D, which is set on the controller 9 in advance, is not always constant but may be rewritten at an arbitrary time.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-032037 filed Feb. 17, 2010 which is hereby incorporated by reference herein its entirety.

What is claimed is:

1. An imprint apparatus that molds an uncured resin on a substrate using a mold to form a resin pattern on the substrate, the apparatus comprising:

a measuring device configured to project a light onto the mold and to receive a light scattered by the mold to obtain a measurement signal based on the received scattered light; and a controller configured to store a reference signal, an upper limit value and a lower limit value, programmed to cause the measuring device to obtain the measurement signal, and programmed to output information indicating which one of the upper limit value and the lower limit value that a discrepancy between the measurement signal and the reference signal exceeds, wherein the upper limit value is a threshold corresponding to one of a defective convex portion and adhering matter in the mold, and the lower limit value is a threshold corresponding to the other of the defective convex portion and the adhering matter.

2. The apparatus according to claim 1, wherein the controller is programmed to cause the measuring device to obtain the measurement signal with respect to a reference mold in advance to obtain the reference signal.

3. The apparatus according to claim 2, wherein the controller is programmed, if a mold is loaded from an outside of the apparatus to an inside of the apparatus, to cause the measuring device to obtain the measurement signal with respect to the loaded mold, as the reference mold, before the uncured resin is molded using the loaded mold, to obtain the reference signal.

4. The apparatus according to claim 1, further comprising:
a console,
wherein the controller is programmed to cause the console to output the information.

5. The apparatus according to claim 1, further comprising:
a mold holder configured to hold the mold,
wherein the controller is programmed, if a first mold held by the mold holder is replaced by a second mold, to cause the measurement device to obtain the measurement signal with respect to the first mold.

6. The imprint apparatus according to claim 1, further comprising:
a mold holder configured to hold the mold,
wherein the controller is programmed, if a first mold held by the mold holder is replaced by a second mold, to cause the measurement device to obtain the measurement signal with respect to the second mold.

7. The apparatus according to claim 1, further comprising:
a substrate holder configured to hold the substrate,
wherein the controller is programmed to cause the measurement device to obtain the measurement signal while a first substrate held by the substrate holder is replaced by a second substrate.

8. The apparatus according to claim 1, further comprising:
a mold holder configured to hold the mold; and
a substrate holder configured to hold the substrate and to be moved, wherein
the measuring device includes a light projecting unit configured to project the light and a light receiving unit configured to receive the scattered light,
the light projecting unit and the light receiving unit are disposed on the substrate holder, and
the controller is configured to move the substrate holder relative to the mold held by the mold holder to cause the measuring device to obtain the measurement signal.

9. A method of manufacturing an article, the method comprising:
molding an uncured resin on a substrate using a mold to form a resin pattern on the substrate using an imprint apparatus; and processing the substrate on which the pattern has been formed, to manufacture the article, wherein the imprint apparatus comprises:

a measuring device configured to project a light onto the mold, and to receive a light scattered by the mold to obtain a measurement signal based on the received scattered light; and a controller configured to store a reference signal, an upper limit value and a lower limit value, programmed to cause the measuring device to obtain the measurement signal, and programmed to output information indicating which one of the upper limit value and the lower limit value that a discrepancy between the measurement signal and the reference signal exceeds wherein the upper limit value is a threshold corresponding to one of a defective convex portion and adhering matter in the mold, and the lower limit value is a threshold corresponding to the other of the defective convex portion and the adhering matter.

10. An apparatus that inspects a mold for abnormality thereof, the mold being used for molding an uncured resin on a substrate to form a resin pattern on the substrate, the apparatus comprising:

a measuring device configured to project a light onto the mold, and to receive a light scattered by the mold to obtain a measurement signal based on the received scattered light; and a controller programmed to cause the measuring device to obtain the measurement signal, and programmed to output information indicating which one of an upper limit value and lower limit value that a discrepancy between the measurement signal and a reference signal exceeds, wherein the upper limit value is a threshold corresponding to one of a defective convex portion and adhering matter in the mold, and the lower limit value is a threshold corresponding to the other of the defective convex portion and the adhering matter.

11. A method of inspecting a mold for abnormality thereof, the mold being used for molding an uncured resin on a substrate to form a resin pattern on the substrate, the method comprising:

projecting a light onto the mold;

receiving a light scattered by the mold to obtain a measurement signal based on the received scattered light;

outputting information indicating which one of an upper limit value and lower limit value that a discrepancy between the measurement signal and a reference signal exceeds wherein the upper limit value is a threshold corresponding to one of a defective convex portion and adhering matter in the mold, and the lower limit value is a threshold corresponding to the other of the defective convex portion and the adhering matter.

12. An imprint apparatus that molds an uncured resin on a substrate using a mold to form a resin pattern on the substrate, the apparatus comprising:

a measuring device configured to project a light onto the mold, and to receive a light scattered by the mold to obtain a measurement signal based on the received scattered light; and a controller programmed to cause the measuring device to obtain the measurement signal, and programmed to output information indicating which one of an upper limit value and a lower limit value that a discrepancy between the measurement signal and a reference signal exceeds, wherein the upper limit value is a threshold corresponding to one of a defective convex portion and adhering matter in the mold, and the lower limit value is a threshold corresponding to the other of the defective convex portion and the adhering matter.

13. The apparatus according to claim 12, wherein the controller is programmed to cause the measuring device to obtain the measurement signal with respect to a reference mold in advance to obtain the reference signal.

14. The apparatus according to claim 12, wherein the upper limit value is a positive value, and the lower limit value is a negative value.

15. The apparatus according to claim 10, wherein the controller is configured to store the reference signal, the upper limit value and the lower limit value.

16. The apparatus according to claim 1, wherein the controller is programmed to compare the measurement signal with the reference signal, and to output an index data based on the comparison.

17. The apparatus according to claim 1, wherein the upper and the lower limit values correspond to thresholds for a defective convex portion and adhering matter in the mold, respectively.

18. The apparatus according to claim 16, wherein the controller is programmed to output information indicating which one of the upper limit value and the lower limit value has been exceeded.

19. The apparatus according to claim 10, wherein the controller is programmed to compare the measurement signal with the reference signal, and to output an index data based on the comparison.

20. The apparatus according to claim 10, wherein the upper and the lower limit values correspond to thresholds for a defective convex portion and adhering matter in the mold, respectively.

21. The apparatus according to claim 19, wherein the controller is programmed to output information indicating which one of the upper limit value and the lower limit value has been exceeded.

22. The apparatus according to claim 12, wherein the controller is programmed to compare the measurement signal with the reference signal, and to output an index data based on the comparison.

23. The apparatus according to claim 12, wherein the upper and the lower limit values correspond to thresholds for a defective convex portion and adhering matter in the mold, respectively.

24. The apparatus according to claim 22, wherein the controller is programmed to output information indicating which one of the upper limit value and the lower limit value has been exceeded.

* * * * *